United States Patent [19]
Toy et al.

[11] Patent Number: 5,956,576
[45] Date of Patent: Sep. 21, 1999

[54] ENHANCED PROTECTION OF SEMICONDUCTORS WITH DUAL SURFACE SEAL

[75] Inventors: Hilton T. Toy, Wappingers Falls; Frank L. Pompeo, Middletown, both of N.Y.

[73] Assignee: International Business Machines Corporation, Armonk, N.Y.

[21] Appl. No.: 08/713,378

[22] Filed: Sep. 13, 1996

[51] Int. Cl.$^6$ .................................................. H01L 21/44
[52] U.S. Cl. ........................ 438/125; 438/122; 257/704; 257/712
[58] Field of Search ................................. 438/121, 122, 438/123, 124, 125, 126; 251/704

[56] References Cited

U.S. PATENT DOCUMENTS

| | | | |
|---|---|---|---|
| 4,291,815 | 9/1981 | Gordon et al. | 220/200 |
| 4,626,460 | 12/1986 | Hamano et al. | 257/704 |
| 4,746,583 | 5/1988 | Falanga | 428/632 |
| 4,833,102 | 5/1989 | Byrne et al. | 438/125 |
| 4,839,716 | 6/1989 | Butt | 257/704 |
| 4,999,699 | 3/1991 | Christie et al. | 357/65 |
| 5,064,782 | 11/1991 | Nishiguchi | 435/125 |
| 5,064,968 | 11/1991 | Kovacs et al. | 257/704 |
| 5,258,576 | 11/1993 | Neumann et al. | 257/704 |
| 5,414,300 | 5/1995 | Tozawa et al. | 257/704 |
| 5,471,027 | 11/1995 | Call et al. | 219/85.13 |
| 5,710,459 | 1/1998 | Teng et al. | 257/704 |
| 5,744,863 | 4/1998 | Culnane et al. | 257/704 |

FOREIGN PATENT DOCUMENTS

| | | | |
|---|---|---|---|
| 5-13602 | 1/1993 | Japan | 257/704 |
| 5-267486 | 10/1993 | Japan | 257/704 |

*Primary Examiner*—Kevin M. Picardat
*Attorney, Agent, or Firm*—Aziz M. Ahsan

[57] ABSTRACT

The present invention relates generally to a new apparatus and method for encapsulating ceramic chip carriers. More particularly, the invention encompasses an apparatus and a method for providing a fluid-tight, non-hermetic seal to a ceramic chip carrier utilizing dual surfaces. This is done by using the corner edges of the chip carrier, i.e., by using not only a minimal amount of the top-surface real estate of the chip carrier, but also the side-walls of the chip carrier to create the dual surface seal. This dual surface seal can be both hermetic and non-hermetic.

42 Claims, 2 Drawing Sheets

ENHANCED PROTECTION OF SEMICONDUCTORS WITH DUAL SURFACE SEAL

FIELD OF THE INVENTION

The present invention relates generally to a new apparatus and method for encapsulating ceramic chip carriers. More particularly, the invention encompasses an apparatus and a method for providing a fluid-tight, seal to a ceramic chip carrier utilizing dual surfaces. This is done by using the corner edges of the chip carrier, i.e., by using not only a minimal amount of the top-surface real estate of the chip carrier, but also the side-walls of the chip carrier to create the dual surface seal. This dual surface seal can be both hermetic and non-hermetic.

BACKGROUND OF THE INVENTION

Semiconductor devices are becoming smaller and more dense with the evolution of new technology. Therefore, there is a constant demand to increase circuit density and to optimize the real estate available for the circuits. However, increases in circuit density produce a corresponding increase in overall chip failure rates at a time when chip failure rates must decrease to remain competitive. Chip manufacturers are therefore constantly challenged to improve the quality of their products by identifying and eliminating defects and also to enhance their products. Whereas significant improvements are being made to eliminate systematic defects by reducing process variability. Process improvements alone are not sufficient to eliminate all the random defects which effect both yield and reliability. Historically, screening techniques have been employed to improve product failure rates to acceptable levels by culling out many of these random defects.

U.S. Pat. No. 4,291,815 (Gordon, et al.) discloses a ceramic lid assembly which includes an integral heat fusible layer defining a hermetic sealing area provided around the periphery of the ceramic lid for hermetic sealing of semiconductor chips in a flat pack.

U.S. Pat. No. 4,746,583 (Falanga) discloses a ceramic combined cover, where a solder layer in the form of a pre-cut gold-tin solder frame is tack welded onto a gold layer. The gold layer is readily wettable by the solder layer and is also extremely corrosion resistant.

U.S. Pat. No. 5,471,027 (Call, et al.), discloses a method for forming chip carrier with a single protective encapsulant. He specifically teaches the use of a picture-frame type area, which is only on the top surface and away from the edges of the substrate, to seal the cap or cover or heat sink to the substrate using a cap sealant.

However, this invention addresses the issue of optimizing the real estate available on a ceramic substrate by providing a fluid-tight seal to a ceramic chip carrier. This is done by using a novel dual surface seal. Basically, the dual surface seal is at the corner edges of the chip carrier, i.e., a minimal amount of the top-surface real estate of the chip carrier in conjunction with the side-walls of the chip carrier are used to create this dual surface seal. This dual surface seal can be both hermetic and non-hermetic.

PURPOSES AND SUMMARY OF THE INVENTION

The invention is a novel method and an apparatus for providing a dual surface seal.

Therefore, one purpose of this invention is to provide an apparatus and a method that will provide a dual surface seal.

Another purpose of this invention is to provide for a fluid-tight dual surface seal.

Still another purpose of this invention is to have a hermetic dual surface seal.

Yet another purpose of this invention is to provide a dual surface seal for a chip carrier, where the seal is at the edges of the chip carrier and minimum top-surface and side-walls of the chip carrier are used to provide the novel dual surface seal.

Still yet another purpose of the invention is to have a cover with an extension to assist in providing the dual surface seal.

Therefore, in one aspect this invention comprises a method of mating a cover to a substrate, comprising the steps of:

(a) applying at least one layer of material at at least one edge of said substrate such that said at least one layer of material covers at least a portion of horizontal and at least a portion of vertical surface of said edge, (b) placing peripheral edge of said cover over at least a portion of said at least one layer of said material, such that said at least a portion of vertical and at least a portion of horizontal surface of said peripheral edge are in direct contact with and secured to said at least one layer of material.

In another aspect this invention comprises an electronic device comprising a substrate, a cover, wherein said substrate and said cover are secured to each other via at least one seal band, such that said at least one seal band is at the outer peripheral edge of said substrate, and wherein at least a portion of said seal band covers at least a portion of a vertical peripheral edge and at least a portion of a horizontal peripheral edge of said substrate.

In yet another aspect this invention comprises an electronic device comprising a substrate, a cover, a lid, wherein said substrate and said cover are secured to each other via at least one first seal band, such that said at least one first seal band is at the outer peripheral edge of said substrate, and wherein at least a portion of said first seal band covers at least a portion of a vertical peripheral edge and at least a portion of a horizontal peripheral edge of said substrate, and wherein said lid and said cover are secured to each other via at least one second seal band, such that said at least one second seal band is at the inner peripheral edge of said cover, and wherein at least a portion of said second seal band covers at least a portion of a vertical peripheral edge and at least a portion of a horizontal peripheral edge of said cover.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Designers of chip carriers are under ever-increasing pressure to maximize the utilization of available top surface design space to package electronic components, giving the highest regard to cost and space efficiencies. Current methods to produce a fluid-tight, non-hermetic seal involve the use of a primerless, silicone based elastomer (Sylgard 577, trademark of Dow Corning) which is uniformly applied to either lid or substrate which is mechanically fixtured and then cured in an oven with a suitable curing schedule. The limitation of this method can be seen from empirically determined rules for estimating the minimum sealband needed as a function of carrier XY size. The generally accepted rule for this process calls for up to 10 percent of the carrier size dedicated to seal band area to assure high reliability and process yields.

The invention described herein solves this problem by making effective use of the carrier thickness, while minimizing the top surface area required for sealing. As such, designers can now more efficiently package components for a given carrier size with minimal regard for use of top surface real estate.

IBM's multi-layered ceramic (MLC) electronic packages are among the most technically advanced electronic packages in the industry. This invention describes one way to further enhance such packages without any loss or degradation of their performance. Additionally, packaging methods which reduces cost advantageously increases the availability of such electronic packages in the marketplace. As a person skilled in the art knows that increased packaging density is typically achieved by greater utilization of the real estate of the substrate or module.

The inventors are also disclosing different preferred embodiments of the invention. One utilizes a one-piece cap and/or heatsink constructed of aluminum, copper and other high thermal conductivity materials. Another embodiment comprises a separable perimeter frame, which is first joined to carrier followed by the attachment of an aluminum, copper or similar highly thermally conductive alloy lid.

Also disclosed is a hermetic seal option which is primarily presented for high reliability applications.

Figure 1:
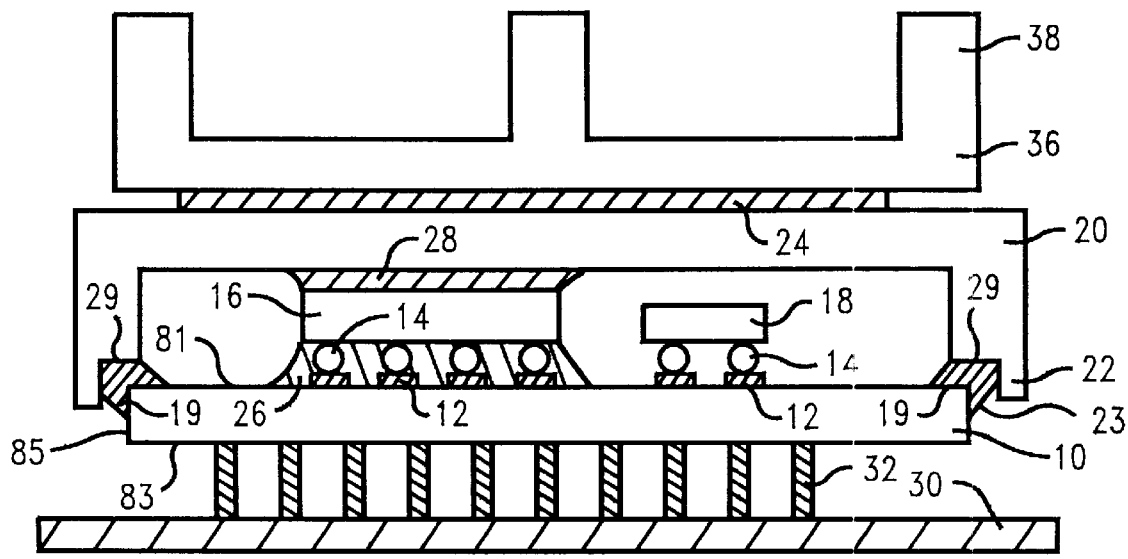
FIG. 1, illustrates a preferred embodiment of this invention.

FIG. 1, illustrates one preferred scheme to connect a chip 16, to a heat sink 36. Typically, the chip 16, is first secured to a substrate or module 10, via a plurality of solder balls 14, on pads 12, that are on the substrate or module 10. The substrate 10, could also have one or more electronic device (s) 18, such as, for example, a decoupling capacitor 18, that is also electrically connected to the substrate 10, via the pads 12, and solder balls 14.

The inventors of this invention have discovered that one way to increase the surface usage area of the substrate 10, is to move the sealband area outward on the substrate 10. This increases the available surface area of the substrate 10, for pads 12, which are typically used by SMD (Surface Mount Devices) interconnects 14, used for the chip 16, and discrete devices, such as decoupling capacitors 18, with its own pads 12, and electrical interconnect 14. However, if only the conventional top surface metallurgy (TSM) area 81, is used then one would get the fluid-tight seal only if a larger surface area on the TSM 81, is used. However, as stated earlier the inventors with their dual surface seal 23, can use a minimum amount of TSM area 81, in conjunction with the substrate side-wall 85, at around the corner area 19, to provide an effective dual surface bond or seal 23.

In the prior art the cap 20, is directly attached in a picture frame area on the TSM area 81. However, the inventive cap 20, of this invention has a ledge or lip or extension 22, and corner area 29, to contribute to the dual surface seal of this invention.

A thermally conductive material or thermal compound 28, could be applied over the backside or the exposed surface of the chip 16, or on the inside of the cap 20, such that a direct thermal contact is made between the chip 16, and the cap or cover 20, when the cover 20, is placed over to protect the chip 16.

The inventive dual surface corner cap sealant 23, is then used in order to secure the cap or cover 20, to the substrate or module 10. The sealant 23, is placed between the corner area 19, of the substrate 10, and the corner area 29, and ledge 22, of the cap 20, to provide the dual surface seal of this invention. The sealant 23, is then allowed to secure the substrate 10, to the cap 20.

The heat sink 36, can now be secured to the cap or cover 20, using a heat sink adhesive 24, which provides an efficient heat transfer path via the heat sink adhesive 24, to the heat sink 36. The heat sink 36, could have one or more fins 38. However, the heat sink 36, could be a heat spreader 36, as more clearly seen in FIG. 3.

The substrate 10, is typically secured at the BSM (bottom surface metallurgy) area 83, to a mother board or card 30, via I/O (Input/Output) means 32, such as, for example, pads, pins, etc. The interconnects 32, can be of a Ball Grid Array (BGA), Column Grid Array (CGA), or Pin Grid Array (PGA) type.

The cap or cover 20, is preferably a metallic or ceramic cap, that is placed over the chip 16, and is permanently secured to the surface of the substrate 10. This is done primarily to prevent mechanical and chemical injury to the chip 16, solder balls 14, decoupling capacitors 18, encapsulant 26 and any exposed metallurgy or circuitry on the substrate 10. A leak in the cap 20, or in the cap sealant 23, or any misalignment of the cap 20, may result in irrecoverable module yield losses and degrade expected reliability performance under actual use conditions. These losses could be substantial for an expensive module.

A picture-frame type area at the peripheral edge of the TSM (top surface metallurgy) area 81, of the substrate 10, in conjunction with the side wall area 85, is required to specifically seal the cap 20, to the substrate 10, using the corner cap sealant 23. This frame type surface could be between about 2 mm and about 6 mm wide. Therefore, the placement of all devices, such as, for example, chips 16, decoupling capacitors 18, is restricted to be within this picture frame area, which can now be expanded to between about 50 percent and about 90 percent, of the area that would otherwise be available for additional or larger devices. The width of this frame type will vary as a function of overall substrate size, using empirically derived functional data. Therefore, the placement of all devices, such as, for example, chips 16, decoupling capacitors 18, is restricted to be within this picture frame area, which preferable should be over 70 percent, of the area.

The substrate 10, could be an alumina substrate, or a ceramic substrate or a plastic substrate. The substrate 10, typically also has a circuitized surface 81, which includes circuit lines (not shown) and electrical contact pads 12. However, for ease of understanding all the different types of substrates or modules will be referred to as substrate 10.

The interconnects or solder balls 14, can be encapsulated with an encapsulant 26, having a TCE (Thermal Coefficient of Expansion) which is within 30 percent of the TCE of the solder balls 14. The composition of the encapsulant 26, includes, for example, an epoxy binder, e.g., a cycloaliphatic polyepoxide binder, and a filler, e.g., high purity fused or amorphous silica, such as disclosed in U.S. Pat. No. 4,999, 699, the disclosure of which is incorporated herein by reference.

However, for some applications the solder balls 14, and pads 12, could be encapsulated with a polymeric underfill material 26. The composition used to form the coating 26, could be dispensed onto the circuitized surface 81, such as, using a syringe, and allowing the composition 26, to freely flow over this surface in order to cover the exposed circuitry after being dispensed. This free flow of the composition 26, is mostly due to the influence of capillary action, which readily flows up the sides of the solder ball with the encapsulant 26. In addition, this composition 26, may thereafter relatively quickly and conveniently be cured using UV radiation.

The polymeric underfill material 26, not only provides environmental protection to the interconnects 14, but also provides fatigue enhancement to the solder connection 14, such as, for example, C4 (Controlled Collapsed Chip Connection) 14.

Furthermore, with this dual surface seal design one also gets additional space on the substrate 10, for the polymeric underfill material 26, especially the overflow, which is very critical in large chip SCM (Single Chip Module) or very densely populated devices on MCM (Multi-Chip Module) designs.

One preferred encapsulant 26, is EPX 5341, which is a trademark of IBM Corporation, Armonk, N.Y., USA, and which is manufactured under a license by Polyset Company Incorporated, Mechanicville, N.Y., USA. This encapsulant 26, has specific two stage cure process, consisting of a gel stage and a hardening stage. With this two stage cure process one not only achieves full environmental protection but also obtains solvent exposure resistance.

It should also be understood that for some applications a double-sided, pressure-sensitive, thermally conductive adhesive tape 24, could be used to secure and provide a direct thermal and mechanical path between the cover 20, and the heat sink or spreader 36.

The dual surface sealing of the cap 20, preferably a metal cap 20, to the substrate 10, such as, for example, a ceramic substrate 10, could also be done for some cases using a heat-curable silicone elastomer 23. However, a sealant, such as, Sylgard 577, can also be used as the dual surface sealer 23, to secure the cap 20, onto the substrate 10.

In order to provide the non-hermetic module seal with a high manufacturing yield, the side of substrate 10, which is adjacent to TSM (Top Surface Metallurgy) area 81, is used to provides the corner cap seal 23. In the prior art the width of the seal is normally from about 9 to about 10 percent of the substrate size on a standard top surface seal. However, with this invention this seal band can be reduced to about 3 percent on a corner cap seal, as more clearly shown in the Figures.

For example, for a 64 mm substrate with only a top surface seal, one would typically need about 5.6 mm top surface to provide the top surface seal band. However, with this inventive dual surface seal or corner surface seal 23, one only needs about 2.0 mm seal band on the top surface with the balance sealing being obtained from the surface of the side walls 85, of the substrate 10.

Furthermore, in the prior art one always leaves room at the edge for any overflow from the top surface seal band or to give enough real estate at the edge to make the top surface seal. This typically takes up an additional 1.0 mm or so of the top surface space. See for example, FIG. 1, of U.S. Pat. No. 5,471,027 (Call et al.), the disclosure of which is incorporated herein by reference. Therefore, the total seal width saving for a 64 mm substrate is 4.6 mm per side (6.6 mm vs 2.0 mm) on the top surface of substrate alone.

After the thermal paste or compound 28, has been applied on the top or back surface of the chip 16, and/or on the inside of the cap 20, the cap 20, can then be placed on top of the substrate 10. This assembly is then placed in a fixture with interconnect 32, in the up position. This is done primarily to develop a good internal side fillet. The fixture load is about 0.5 to about 2.5 Kg in order to provide a uniform load for a good adhesive bondline. The 2 stage curing process for Sylgard 577 is preferably used, which consist of: (a) placing the assembly in a temperature environment of about 60 to about 80° C. for about 60 minutes to reduce yield loss, and then (b) ramping to about 135° C., and (c) then curing for about an additional 15 minutes to fully cure the sealing material. The assembled module can now be leak tested prior to going to the next level, such as, the card assembly level.

For most applications the size of the cap 20, could be about 1 mm beyond the edge of the substrate 10, on all sides. Therefore, for example, for a 64 mm substrate the module footprint would be about 66 mm. The 1 mm extension can vary from about 0.1 mm to about 1.0 mm. The corner cap 20, can be fabricated with metal forming processes for a simple cap design without heatsinks. Corner cap design with strengthening ribs or features can also be fabricated to reduce top cap 20, deflection. The sealband area could have a roughness (Ra) of about 12.5 micron maximum and surface flatness of about 0.08 mm to provide thin bondline for the seal between the cap 20, and the substrate 10. The clearance gap between the TSM 81, of the substrate 10, and cap 20, should be about 0.03 mm in the worst case when the cap cavity is at minimum size and the substrate is at maximum size. For most applications the height of the seal on the side-wall 85, is about 1.0 mm to about 1.6 mm down from the substrate TSM 81. However, the height of the side-seal can go all the way down the substrate side wall 85, to provide adequate sealing as long as there is no interference with substrate interconnect due adhesive contamination of BSM 83. The cavity ID of the cap corner can be square or chamfer with a minimum of 0.05 mm clearance where the corner walls of cap do not break out. This prevents sealing material from running out and weakening the strength of the seal which will cause internal pressure blow out during curing of seal material (pressure will seek path of least resistance).

The module assembly process consists of dispensing the Sylgard 577 or elastomer sealing material either on the cap sealband 29, or edge perimeter 19, of the substrate 10. The Sylgard 577 is a flexible silicone material which compensates for CTE (coefficient of thermal expansion) mismatch between alumina substrate and aluminum (or metal) caps. The viscosity for the Sylgard 577 is about 63,400 centipoise at 25° C. One needs a high viscosity material so that the material does not run after application on the cap or the substrate. The substrate 10, is placed into the cap 20, and this assembly is then cured in a convection oven. The substrate interconnect 32, are preferably in the up position during curing. This is critical to form the side fillet or the dual seal band 23, which provide a "potting" effect to provide a reliable, non-hermetic seal. The "potting" effect also lets the sealing material fills the sidewalls between the cap 20, and substrate 10. The "potting" effect also enhances the sealing strength by adding gap material between cap and substrate (reduce blow out problem during sealing). The assembled module can then be processed through gross leak testing. Any steady stream bubbles emanating from the seal constitutes a leak test fail. If the module fails leak testing it can be reworked. After the module assembly passes the leak test it is then placed in the oven with interconnect 32, in the up position which then will also prevent the sealing material from running down the side walls 85, of the substrate 10, and contaminating the BSM (bottom surface metallurgy) 83, for interconnects 32. This corner cap design allows for automatically centering the substrate within the cap which reduce the amount of fixturing hardware used in aligning the cap to substrate components. A uniform load can also be applied using a load of about 0.5 to about 2.5 kg on the substrate, which is against the cap to provide a good adhesive seal bondline. The fixture with module assembly is next placed in a convection oven for adhesive curing.

As stated earlier that if the module fail leak testing it can be reworked. For rework the module assembly can also be heated to 120° C. and the Sylgard adhesive is applied on the leak site and the module is then allowed to be cooled. This will draw the Sylgard material into the leak area, such as, a pin hole and fill it. The reworked module is then cured with the above-mentioned 2 stage cure process and leak tested again. After passing the leak test the module is now ready to be used for the card assembly level.

Figure 2:
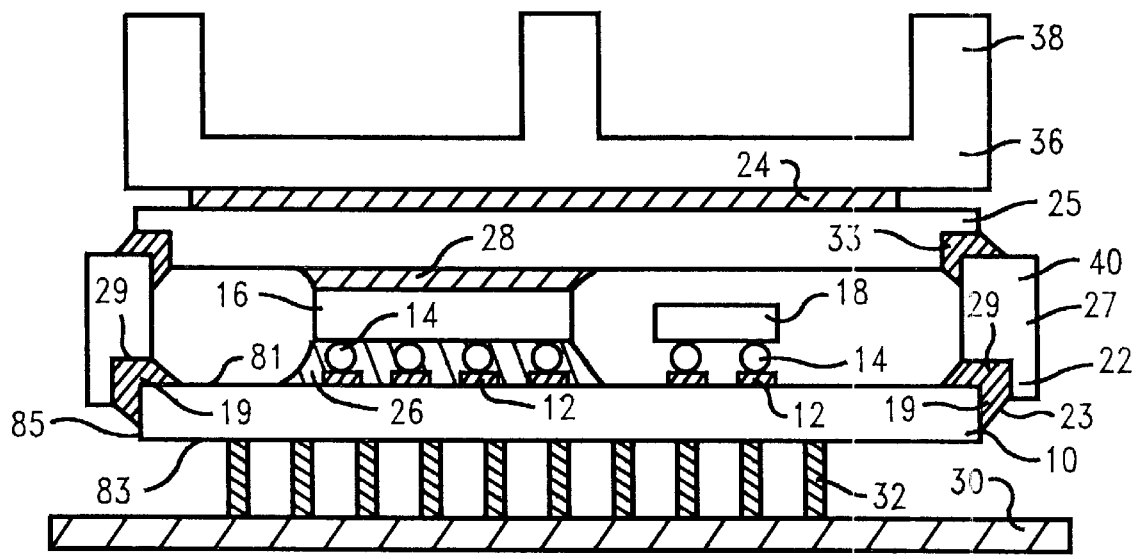
FIG. 2, illustrates another preferred embodiment of this invention.

FIG. 2, illustrates another preferred embodiment of this invention. Here the corner seal design has been enhanced by using a two-piece design. The two-piece design has a seal ring 27, with a lip or extension 22, which is initially attached to the corner area 19, of the substrate 10, using dual surface sealant 23, after the devices, such as, for example, chip 16, and decoupling capacitors 18, have already been joined.

Depending upon the sealant 23, the attachment of the seal ring 27, to the substrate 10, can be processed through a very fast cure cycle time, for example, about 150° C. for about 15 minutes, for Sylgard 577, because there is no problem with pressure blow out. After the attachment of the seal ring 27, the polymeric underfill material 26, can be applied and allowed to overflow all the way up to the dual seal area 23, as the dual seal ring area 23, can now act as a stop or dam. The underfill material 26, is then allowed to cure on the substrate 10, with the seal ring 27, in place. The compound 28, can then be placed on top of the chip 16. A cap cover 25, is then secured to the seal ring 27, using a dual surface seal 33, to form a two-piece cap 40. The dual surface seal 33, can be of the same material as the dual surface seal 23, or it could be of a different material. The heat sink or heat spreader 36, can then be secured to the cap cover 25, of the two-piece cap 40, using heat sink adhesive 24, by methods well known in the art, such as, for example, as mentioned with reference to FIG. 1.

Figure 3:
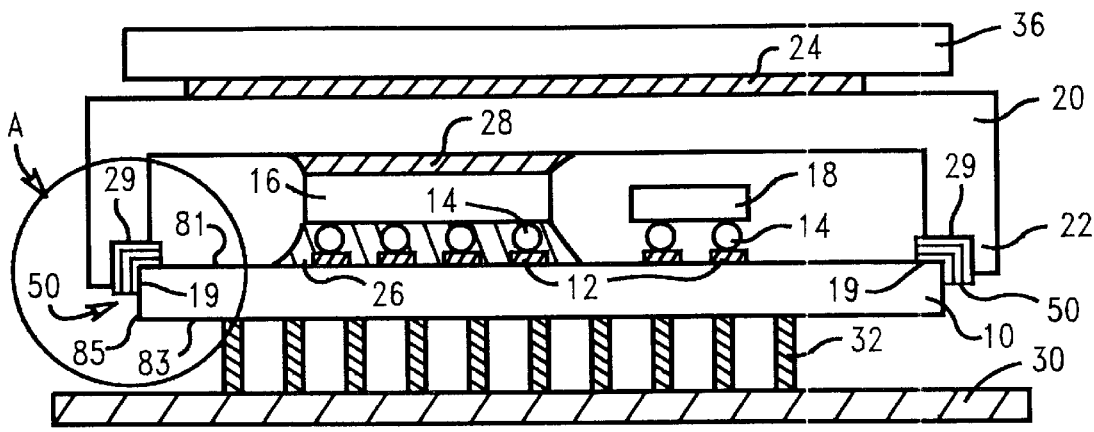
FIG. 3, illustrates yet another preferred embodiment of this invention.

FIG. 3, illustrates yet another preferred embodiment of this invention which provides hermetic sealing. In this embodiment, as stated earlier, typically the chip 16, is first secured to the substrate 10, via a plurality of solder balls 14, on pads 12, that reside on the top surface 81, of the substrate 10. The substrate 10, could also have one or more electronic devices 18, such as a decoupling capacitor 18, that is also electrically connected to the substrate 10, via the metallized pads 12, and either solder balls 14, or surface-mountable solder. A thermally conductive material 28, is usually applied over the exposed surface of the chip 16, such that a direct thermal contact is made between the chip 16, and cap or cover 20, when the cap 20, is placed over to cover the chip 16. A heat sink or heat spreader 36, can now be secured to the cap 20, using a heat sink adhesive 24. The substrate 10, is typically secured to mother board or card 30, via I/O (Input/Output) means 13, such as pads, pins, solder balls, solder columns, etc.

The embodiment of FIG. 3, provides a hermetic seal to the devices on the top surface 81. This hermetic sealing 50, is illustrated in more detail in FIGS. 4, 5 and 6, using an enlarged view of the corner "A".

Figure 4:
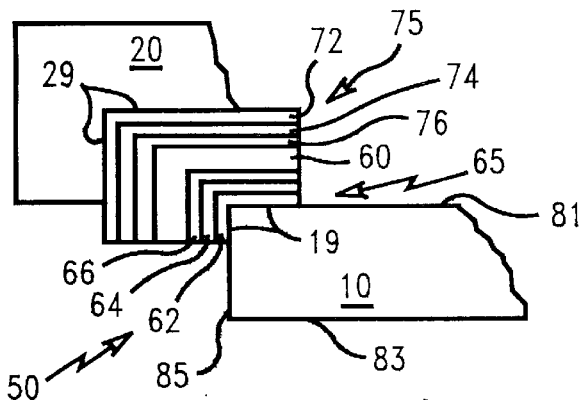
FIG. 4, is an enlarged view of the corner "A" as shown in FIG. 3.

FIG. 4 is an enlarged view of the corner "A" as shown in FIG. 3, in which a dual surface hermetic seal 50, can be achieved by suitable metallization of both the corner 19, of the substrate 10, and the corner 29, of the metallized ceramic or metal alloy lid 20, with a heat fusible zone or bands. The dual surface hermetic seal 50, basically comprises of metallic cap zone 75, metallic substrate zone 65, which are secured to each other using a suitable solder or braze 60.

The choice of soldering and/or brazing alloys 60, can be done using, but not limited to, alloys of Sn (tin) and Pb (lead).

The metallic cap zone 75, is preferably formed by first depositing at least one thick film or co-fired molybdenum (Mo) 72, at the corner area 29. This is then followed by electrolytic or electroless deposition of a nickel layer 74. A thin strike (preferably about 50 microinches) of electroplated gold layer 76, is then formed over the nickel layer 74.

However, to form the metallic substrate zone 65, the metallization of the substrate sidewall 85, around the corner 19, can be accomplished as follows: screen printing of a suitable thick film Mo or Tungsten-based paste 62, which is applied to the edges or corner area 19, of the substrate 10, that is fixtured on edge so as to keep the screen parallel to the substrate side-wall 85, during the application. Equivalently, the viscosity of the Mo paste 62, can be adjusted to allow for selective spraying of the paste along the edges. The metal (Mo) 62, can also be applied in a manual fashion using conventional artist brushes, suitable for low volume production. Following the thick film application of Mo 62, the substrate 10, and Mo thick film 62, are than co-fired at high temperatures. Layers of nickel 64, and gold 66, will subsequently be formed, as will be discussed in more detail in FIG. 5.

Figure 5:
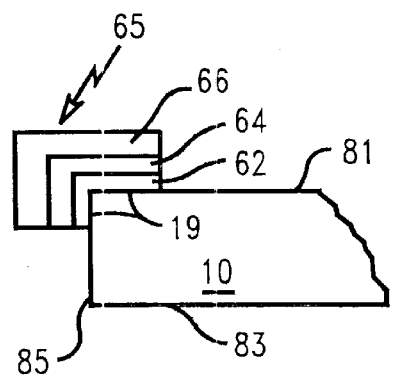
FIG. 5, illustrates a more detailed view of the corner "A" as shown in FIGS. 3 and 4.

FIG. 5, illustrates a detailed view of the metallic substrate zone 65, of the invention. As discussed above, a thick film of molybdenum 62, is first applied to a portion of the TSM surface 81, sidewall 85, around the area 19, of the substrate 10. The substrate 10, along with the Mo coating 62, is then co-fired at a high temperature, typically greater than 1500° C. Nickel (Ni) layer 64, and gold (Au) layer 66, are then deposited, such as, for example, by an electrolytic process.

Figure 6:
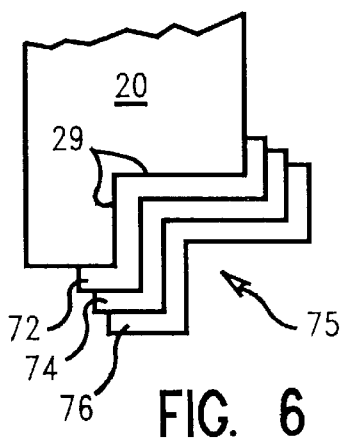
FIG. 6, illustrates a more detailed view of the corner "A" as shown in FIGS. 3 and 4.

FIG. 6, illustrates a detailed view of the metallic cap zone 75, of this invention. As discussed earlier, the cap 20, can be metallized using Mo 72, Ni 74 and Au 76, in the same manner as previously discussed with regard to FIG. 5, except that access to the inside step of the cap 20, is limited to manual, controlled spraying or thin-film-like processing of the metallization band zone 75. Initially, a layer of Mo 72, is applied at the area 29, around the ledge 22, of the cap 20. This is followed by sintering or co-firing. The metallic cap zone 75, is then completed by suitable electroplated nickel layer 74, and the deposition of gold layer 76, for reliable soldering.

Both substrate 10, and the cap 20, require the above described metallization to form the hermetic seal. However, if the cap 20, is of a metallic material of a suitably matched CTE (Coefficient of Thermal Expansion) or comprised of a metallurgically bonded structure of symmetrically clad high/low CTE materials such as Copper Clad Invar (Trademark of Texas Instruments, Inc.) or Copper Clad Molybdenum (Trademark of Climax Specialty Metals, Inc.), then it is only necessary to provide a dense nickel plating 74, either over the entire cap surface area or the corner area 29, followed by a selective strike of electroplated gold layer 76, only on the surface area which will be used as a sealing surface.

Figure 7:
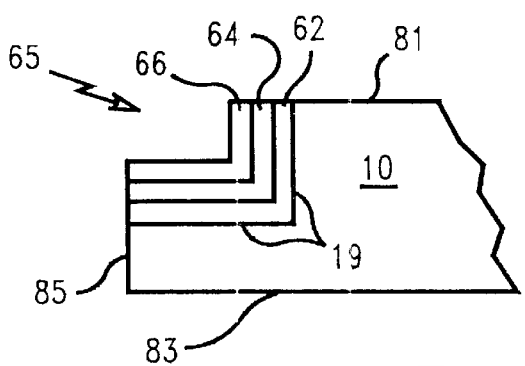
FIG. 7, illustrates a more detailed view of another corner scheme for the substrate of this invention.

FIG. 7, illustrates yet another embodiment of this invention. The substrate 10, corner area 19, is recessed by first machining the laminated-layers in the green state (before firing at high temperatures, such as, for example, greater than 1500° C.). After firing of the substrate 10, such as, for example, an alumina ceramic substrate 10, a Mo 62, thick-film is deposited on external corner area 19, by manual means or by a two-step screening operation and then fired at substantially lower temperatures (preferably in the 600 to about 800° C. range). Metallization of the metallic substrate zone 65, is then completed by electrolytic deposition of nickel 64, followed by electroplating of gold 66, for ensuring adequate solderability. For a 64 mm substrate one would need a nickel layer 64, of an approximate thickness of about 5 microns, and for the gold layer 66, an approximate thickness of about 1 micron.

After the substrate metallic zone 65, and the cap metallic zone 75, have been individually formed, then a suitable layer of solder or braze 60, is then applied to the surface of zones 65 and 75, that are to be joined. The substrate 10, with the metallic zone 65, and the cap 20, with the metallic zone 75, are brought together and heated around the peripheral edges 19 and 29, to allow the solder or braze 60, to join metallic zones 65 and 75, to form the hermetic seal, as more clearly illustrated in FIGS. 3 and 4.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of mating a cover to a substrate, comprising the steps of:
   (a) applying at least one layer of material at at least one edge of said substrate such that said at least one layer of material covers at least a portion of horizontal and at least a portion of vertical surface of said edge,
   (b) placing peripheral edge of said cover over at least a portion of said at least one layer of said material, such that said at least a portion of vertical and at least a portion of horizontal surface of said peripheral edge are in direct contact with and secured to said at least one layer of material.

2. The method of claim 1, wherein at least a portion of at least one surface of said substrate has electrical circuitry.

3. The method of claim 2, wherein at least a portion of said electrical circuitry is encapsulated with at least one encapsulant.

4. The method of claim 1, wherein at least one electronic device is secured to said substrate via at least one first electrical connection.

5. The method of claim 4, wherein said first electrical connection is selected from a group consisting of solder ball, solder column, low-melting point solder and high-melting point solder.

6. The method of claim 4, wherein said at least one electronic device is selected from a group consisting of electronic chip and decoupling capacitor.

7. The method of claim 1, wherein said substrate is itself secured to a card using at least one second electrical connection.

8. The method of claim 7, wherein said second electrical connection is selected from a group consisting of solder ball, solder column, low-melting point solder, high-melting point solder, pad and clip.

9. The method of claim 1, wherein said cover has an extension at the peripheral edge and wherein said extension has a lip that extends beyond said peripheral edge of said substrate.

10. The method of claim 9, wherein said peripheral edge of said cover and said peripheral edge of said substrate are joined with at least one adhesive.

11. The method of claim 10, wherein material for said at least one adhesive is selected from a group consisting of epoxy or polymeric material.

12. The method of claim 1, wherein said at least one sealband contains at least one metallization layer.

13. The method of claim 12, wherein said at least one metallization layer is surrounded by at least one heat-fusible alloy.

14. The method of claim 1, wherein said seal band comprises of at least three layers, wherein said at least one first layer is preferably molybdenum or tungsten thick film layer, said at least one second layer is at least one electrolytically deposited layer of nickel, and said at least one third layer is at least one gold plated layer.

15. An electronic device comprising a substrate, a cover, wherein said substrate and said cover are secured to each other via at least one seal band, such that said at least one seal band is at the outer peripheral edge of said substrate, and wherein at least a portion of said seal band covers at least a portion of a vertical peripheral edge and at least a portion of a horizontal peripheral edge of said substrate.

16. The electronic device of claim 15, wherein at least a portion of at least one surface of said substrate has electrical circuitry.

17. The electronic device of claim 16, wherein at least a portion of said electrical circuitry is encapsulated with at least one encapsulant.

18. The electronic device of claim 15, wherein at least one electronic device is secured to said substrate via at least one first electrical connection.

19. The electronic device of claim 18, wherein said at least one first electrical connection is selected from a group consisting of solder ball, solder column, low-melting point solder and high-melting point solder.

20. The electronic device of claim 18, wherein said at least one electronic device is selected from a group consisting of electronic chip and decoupling capacitor.

21. The electronic device of claim 15, wherein said substrate is itself secured to a card using at least one second electrical connection.

22. The electronic device of claim 21, wherein said second electrical connection is selected from a group consisting of solder ball, solder column, low-melting point solder, high-melting point solder, pad and clip.

23. The electronic device of claim 15, wherein said cover has an extension at the peripheral edge and wherein said extension has a lip that extends beyond said peripheral edge of said substrate.

24. The electronic device of claim 23, wherein said peripheral edge of said cover and said peripheral edge of said substrate are joined with at least one adhesive.

25. The electronic device of claim 24, wherein material for said at least one adhesive is selected from a group consisting of epoxy or polymeric material.

26. The electronic device of claim 15, wherein said at least one sealband contains at least one metallization layer.

27. The electronic device of claim 26, wherein said at least one metallization layer is surrounded by at least one heat-fusible alloy.

28. The electronic device of claim 15, wherein said seal band comprises of at least three layers, wherein said at least one first layer is preferably molybdenum or tungsten thick film layer, said at least one second layer is at least one electrolytically deposited layer of nickel, and said at least one third layer is at least one gold plated layer.

29. An electronic device comprising a substrate, a cover, a lid, wherein said substrate and said cover are secured to each other via at least one first seal band, such that said at least one first seal band is at the outer peripheral edge of said substrate, and wherein at least a portion of said first seal band covers at least a portion of a vertical peripheral edge and at least a portion of a horizontal peripheral edge of said substrate, and wherein said lid and said cover are secured to each other via at least one second seal band, such that said at least one second seal band is at the inner peripheral edge of said cover, and wherein at least a portion of said second seal band covers at least a portion of a vertical peripheral edge and at least a portion of a horizontal peripheral edge of said cover.

30. The electronic device of claim 29, wherein at least a portion of at least one surface of said substrate has electrical circuitry.

31. The electronic device of claim 30, wherein at least a portion of said electrical circuitry is encapsulated with at least one encapsulant.

32. The electronic device of claim 29, wherein at least one electronic device is secured to said substrate via at least one first electrical connection.

33. The electronic device of claim 32, wherein said at least one first electrical connection is selected from a group consisting of solder ball, solder column, low-melting point solder and high-melting point solder.

34. The electronic device of claim 32, wherein said at least one electronic device is selected from a group consisting of electronic chip and decoupling capacitor.

35. The electronic device of claim 29, wherein said substrate is itself secured to a card using at least one second electrical connection.

36. The electronic device of claim 35, wherein said second electrical connection is selected from a group consisting of solder ball, solder column, low-melting point solder, high-melting point solder, pad and clip.

37. The electronic device of claim 29, wherein said cover has an extension at the peripheral edge and wherein said extension has a lip that extends beyond said peripheral edge of said substrate.

38. The electronic device of claim 37, wherein said peripheral edge of said cover and said peripheral edge of said substrate are joined with at least one adhesive.

39. The electronic device of claim 38, wherein material for said at least one adhesive is selected from a group consisting of epoxy or polymeric material.

40. The electronic device of claim 29, wherein said at least one sealband contains at least one metallization layer.

41. The electronic device of claim 40, wherein said at least one metallization layer is surrounded by at least one heat-fusible alloy.

42. The electronic device of claim 29, wherein said seal band comprises of at least three layers, wherein said at least one first layer is preferably molybdenum or tungsten thick film layer, said at least one second layer is at least one electrolytically deposited layer of nickel, and said at least one third layer is at least one gold plated layer.

* * * * *